*(12)* United States Patent
Iino et al.

(10) Patent No.: US 10,859,929 B2
(45) Date of Patent: Dec. 8, 2020

(54) POSITION DETECTION DEVICE, POSITION DETECTION METHOD, IMPRINT APPARATUS, AND METHOD FOR MANUFACTURING ARTICLE

(71) Applicant: CANON KABUSHIKI KAISHA, Tokyo (JP)

(72) Inventors: Satoshi Iino, Kuki (JP); Hiroshi Sato, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 16/280,974

(22) Filed: Feb. 20, 2019

(65) Prior Publication Data

US 2019/0279889 A1    Sep. 12, 2019

(30) Foreign Application Priority Data

Mar. 12, 2018 (JP) .................. 2018-044355

(51) Int. Cl.
*G03F 9/00* (2006.01)
*G03F 7/00* (2006.01)

(52) U.S. Cl.
CPC .......... *G03F 9/7042* (2013.01); *G03F 9/7088* (2013.01); *G03F 7/0002* (2013.01)

(58) Field of Classification Search
CPC .... G03F 7/0002; G03F 9/7042; G03F 9/7076; G03F 7/70683; H01L 21/67259
See application file for complete search history.

(56) References Cited

U.S. PATENT DOCUMENTS

| | | | |
|---|---|---|---|
| 2005/0036144 A1* | 2/2005 | Suzuki | G03F 9/7092 356/401 |
| 2005/0062967 A1* | 3/2005 | Kobayashi | G03F 9/7076 356/400 |
| 2009/0115985 A1* | 5/2009 | Maeda | G03B 27/52 355/55 |
| 2012/0313295 A1* | 12/2012 | Den Boef | B82Y 10/00 264/406 |
| 2017/0307367 A1* | 10/2017 | Yaegashi | G01B 11/272 |

FOREIGN PATENT DOCUMENTS

JP    7-135168 A    5/1995

* cited by examiner

*Primary Examiner* — Steven Whitesell Gordon
(74) *Attorney, Agent, or Firm* — Canon U.S.A., Inc. IP Division

(57) ABSTRACT

A position detection device for adjusting positions of a mold and a substrate using a mold mark formed on the mold and a substrate mark formed on the substrate includes a detection unit configured to detect light from the mold mark and the substrate mark, and a processing unit configured to obtain a positional relationship between the substrate and the mold based on a detection result of the detection unit, wherein the processing unit obtains the positional relationship between the substrate and the mold based on a corrected signal obtained by removing a noise component based on the light from the mold mark from a detected signal based on the light from the mold mark and the substrate mark.

9 Claims, 12 Drawing Sheets

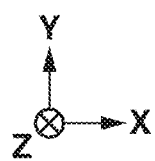

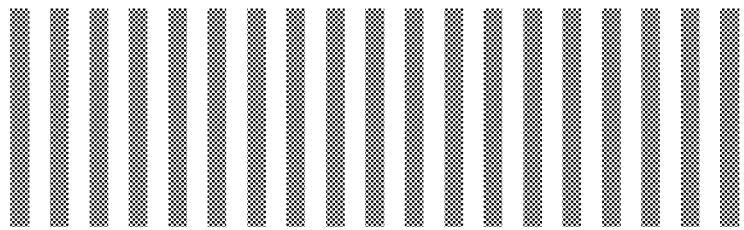
FIG.5D
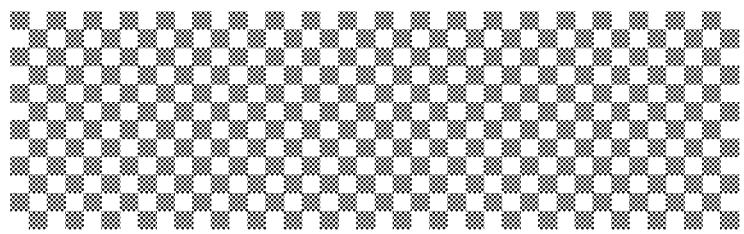
FIG.5C
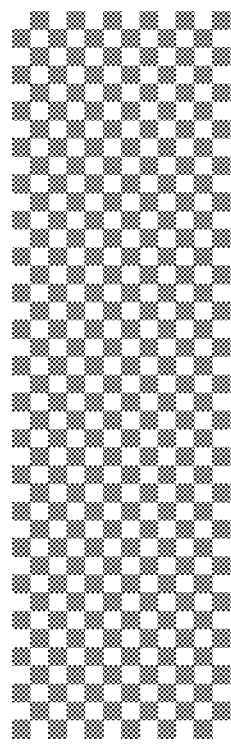
FIG.5A
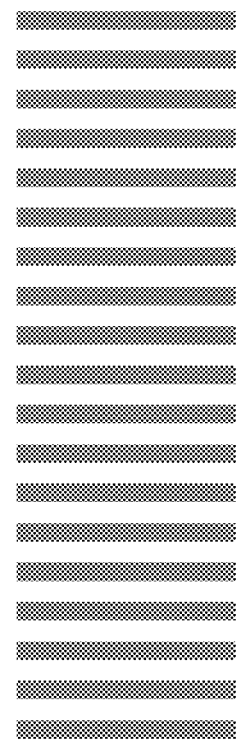
FIG.5B
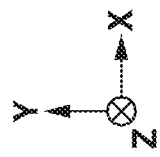

POSITION DETECTION DEVICE, POSITION
DETECTION METHOD, IMPRINT
APPARATUS, AND METHOD FOR
MANUFACTURING ARTICLE

BACKGROUND

Field

The present disclosure relates to a position detection device, a position detection method, an imprint apparatus, and a method for manufacturing an article.

Description of the Related Art

As a method for manufacturing an article such as a semiconductor device or microelectromechanical systems (MEMS), an imprint method for bringing (imprinting) a mold into contact with an imprint material supplied onto a substrate is known. In the imprint method, in the state where the imprint material and the mold are in contact with each other, the imprint material is cured. Then, the mold is pulled away (released) from the cured imprint material, thereby forming the pattern of the imprint material on the substrate.

When bringing a mold into contact with an imprint material on a substrate, an imprint apparatus needs to accurately adjust the positions of the mold and the substrate. As a method for adjusting the positions of the mold and the substrate, a die-by-die alignment method is employed. The die-by-die alignment method is a method for, with respect to each shot area on the substrate, detecting a mark formed in the shot area and a mark formed on the mold, thereby adjusting the positions of the mold and the substrate.

A signal used for the position adjustment can include noise that reduces the accuracy of the position adjustment. To perform the position adjustment without reducing the accuracy, it is desirable to remove noise from the signal used for the position adjustment. Japanese Patent Application Laid-Open No. 7-135168 discusses a method for detecting noise light from outside an alignment mark area in advance and removing a noise component of the noise light from a signal used for position adjustment.

The noise included in the signal used for the position adjustment can include noise that occurs due to the mark formed on the mold. The accuracy of the position adjustment may decrease by the noise that thus occurs due to the mark. Thus, it is necessary to detect in advance the noise that occurs due to the mark formed on the mold, and remove a noise component of the noise.

SUMMARY

According to an aspect of the present disclosure, a position detection device for adjusting positions of a mold and a substrate using a mold mark formed on the mold and a substrate mark formed on the substrate includes a detection unit configured to detect light from the mold mark and light through the substrate mark, and a processing unit configured to obtain a positional relationship between the substrate and the mold based on a detection result of the detection unit, wherein the processing unit obtains the positional relationship between the substrate and the mold based on a corrected signal obtained by removing a noise component based on the light from the mold mark from a detected signal based on the light from the mold mark and the light through the substrate mark.

Further features of the present disclosure will become apparent from the following description of exemplary embodiments with reference to the attached drawings.

BRIEF DESCRIPTION OF THE DRAWINGS

FIGS. 5A to 5D are diagrams illustrating marks including diffraction gratings formed on a mold and a substrate.

DESCRIPTION OF THE EMBODIMENTS

Figure 1A:
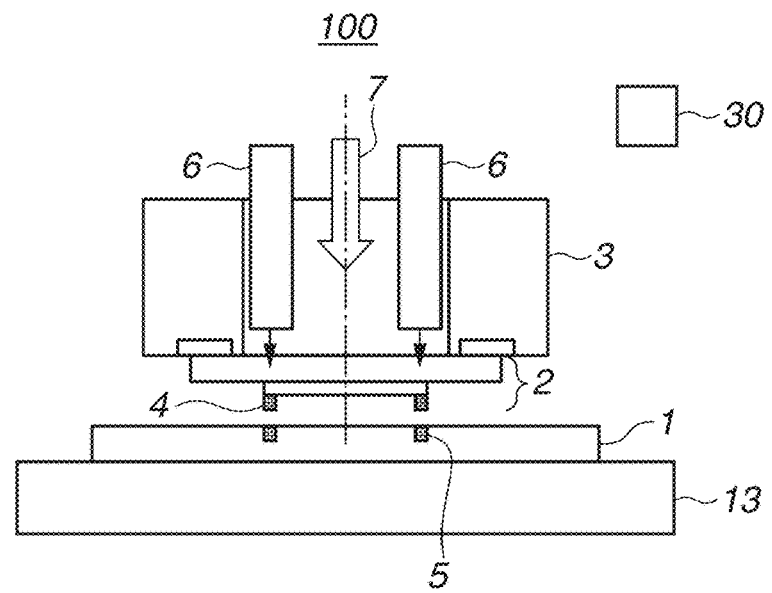
FIGS. 1A and 1B are schematic diagrams illustrating a configuration of an imprint apparatus as an aspect of the present disclosure.

Exemplary embodiments will be described in detail below with reference to the attached drawings. In the drawings, similar members are designated by the same reference numbers, and are not redundantly described.

Figure 1B:
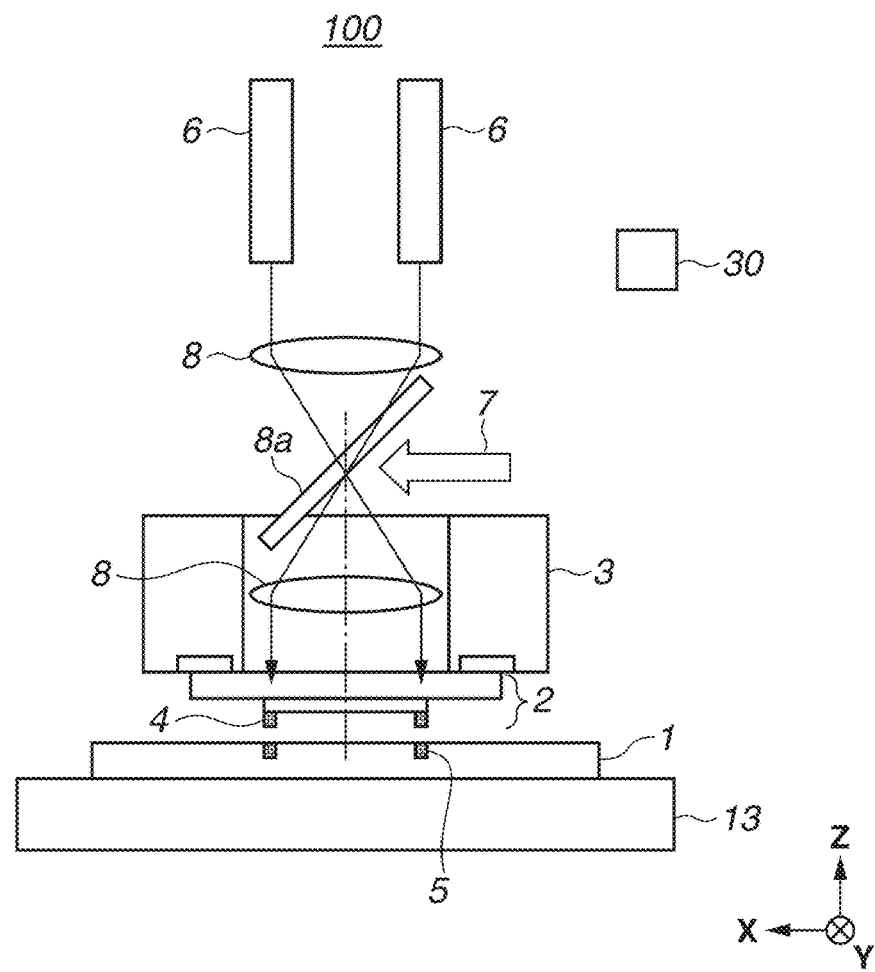

FIGS. 1A and 1B are diagrams illustrating the configuration of an imprint apparatus 100 according to a first exemplary embodiment. With reference to FIGS. 1A and 1B, the configuration of the imprint apparatus 100 will be described. Axes are determined as illustrated in FIGS. 1A and 1B such that a plane on which a substrate 1 is placed is an XY-plane, and a direction orthogonal to the XY-plane is a Z-direction. The imprint apparatus 100 is an apparatus that brings an imprint material supplied onto the substrate 1 into contact with a mold and gives curing energy to the imprint material, thereby forming the pattern of the cured product to which an uneven pattern of the mold is transferred. The imprint apparatus 100 in FIGS. 1A and 1B is used to manufacture a device such as a semiconductor device as an article. In this case, the imprint apparatus 100 employing a light-curing method will be described.

The imprint apparatus 100 is an apparatus that brings an imprint material supplied onto the substrate 1 into contact with a mold and gives curing energy to the imprint material, thereby forming the pattern of the cured product to which an uneven pattern of the mold is transferred.

As the imprint material, a curable composition that cures by being given curing energy (also occasionally referred to as "a resin in an uncured state") is used. As the curing energy, an electromagnetic wave or heat is used. As the electromagnetic wave, light the wavelength of which is selected from the range of 10 nm or more and 1 mm or less, such as infrared light, visible light, or ultraviolet light, is used.

The curable composition is a composition that cures by being irradiated with light or being heated. The light-curable composition that cures by being irradiated with light contains at least a polymerizable compound and a photopolymerization initiator, and may contain a non-polymerizable compound or a solvent, where necessary. The non-polymerizable compound is at least one type selected from a group of a sensitizer, a hydrogen donor, an internal mold release agent, a surfactant, an antioxidant, and a polymer component.

The imprint material may be applied in the form of a film onto the substrate 1 by a spin coater or a slit coater. Alternatively, the imprint material may be applied in the form of a droplet or in the form of an island or a film formed by connecting a plurality of droplets, onto the substrate 1 by a liquid injection head. The viscosity (the viscosity at 25° C.) of the imprint material is, for example, 1 mPa·s or more and 100 mPa·s or less.

The imprint apparatus 100 includes an imprint head 3, a position detection device 6, a substrate stage 13, and a control unit 30. Further, the imprint apparatus 100 also includes a supply unit (a dispenser) for supplying the imprint material onto the substrate 1, a bridge surface plate for holding the imprint head 3, and a base surface plate for holding the substrate stage 13.

The imprint apparatus 100 supplies the imprint material onto the substrate 1 held by the substrate stage 13 and brings the imprint material into contact with a mold 2 (a pattern surface) on which a predetermined pattern is formed. Then, in the state where the mold 2 and the imprint material on the substrate 1 are in contact with each other, the imprint apparatus 100 illuminates the imprint material with ultraviolet light 7, thereby curing the imprint material. Then, the imprint apparatus 100 pulls away (releases) the mold 2 from the cured imprint material, thereby forming the pattern of the imprint material on the substrate 1.

The mold 2 is held by the imprint head 3 (a mold holding unit). Within the imprint head 3, as illustrated in FIG. 1A, the position detection device 6 that optically observes a mold mark 4 formed on the mold 2 and a substrate mark 5 formed on the substrate 1 and thereby detects the relative position (the positional relationship) between the mold mark 4 and the substrate mark 5 is placed. However, in a case where it is difficult to configure the position detection device 6 within (the space of) the imprint head 3, then as illustrated in FIG. 1B, an image forming optical system 8 may form an image of light from the mold mark 4 or the substrate mark 5 above the imprint head 3, and the position detection device 6 may observe the image.

Further, to cure the imprint material on the substrate 1, the imprint apparatus 100 illuminates the imprint material with the ultraviolet light 7 from above the mold 2. Thus, in a case where the image forming optical system 8 is used, then as illustrated in FIG. 1B, a combining prism 8a may be placed within the image forming optical system 8 and combine the optical path of light from the position detection device 6 and the optical path of the ultraviolet light 7. In this case, the combining prism 8a has the property of reflecting the ultraviolet light 7 and transmitting the light from the position detection device 6. The relationship between the position detection device 6 and the ultraviolet light 7 may be opposite. That is, the combining prism 8a may have the property of transmitting the ultraviolet light 7 and reflecting the light from the position detection device 6.

The control unit 30 includes a central processing unit (CPU) and a memory and controls the entire imprint apparatus 100 (the components of the imprint apparatus 100). The control unit 30 controls an imprint process and processing related to the imprint process. For example, when performing the imprint process, based on the detection result of the position detection device 6, the control unit 30 moves the imprint head 3 or the substrate stage 13 in the xy-direction or a rotational direction (θz) about the z-axis, thereby adjusting the positions of (aligning) the mold 2 and the substrate 1. The control unit 30 may be provided in the imprint apparatus 100, or may be installed in a different location from the imprint apparatus 100 and remotely control the imprint apparatus 100.

Figure 2:
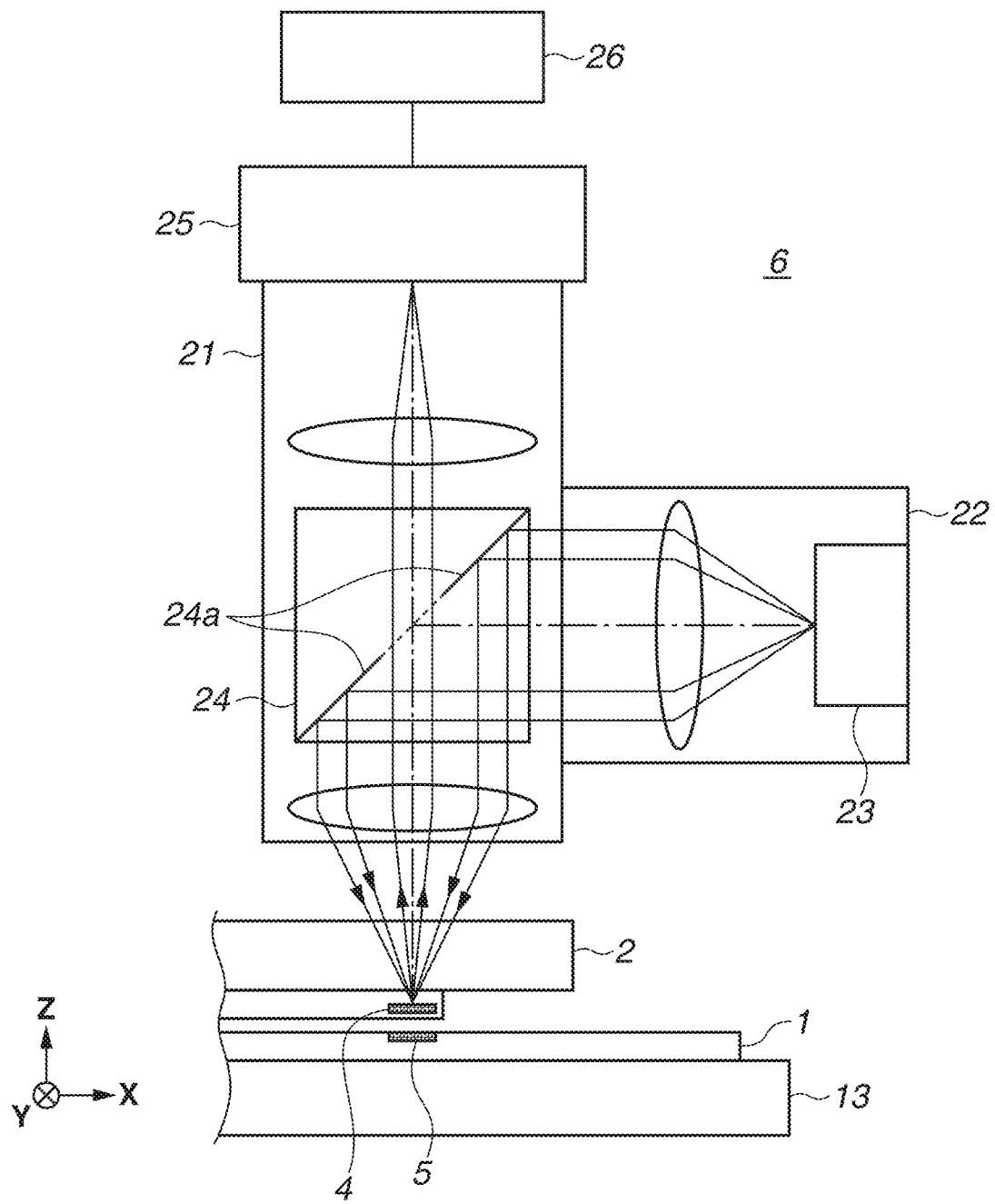
FIG. 2 is a schematic diagram illustrating an example of a configuration of a position detection device.

A description will be given of the details of the position detection device 6 that detects the mold mark 4 formed on the mold 2 and the substrate mark 5 formed on the substrate 1. FIG. 2 is a schematic diagram illustrating an example of the configuration of the position detection device 6. The position detection device 6 includes a detection optical system 21 and an illumination optical system 22. In the position detection device 6 in FIG. 2, a part of (the optical axis of) the detection optical system 21 and a part of (the optical axis of) the illumination optical system 22 are common.

The illumination optical system 22 guides light from a light source 23 onto the same optical axis as that of the detection optical system 21 using an optical member such as a prism 24 and illuminates the mold mark 4 and the substrate mark 5. As the light source 23, for example, a halogen lamp or a light-emitting diode (LED) is used. The light source 23 emits light of a wavelength different from the wavelength of the ultraviolet light 7. In the present exemplary embodiment, since the ultraviolet light 7 is used as light for curing the imprint material, the light source 23 emits visible light or infrared light.

As described above, the detection optical system 21 and the illumination optical system 22 are configured to share some of optical members included in the detection optical system 21 and the illumination optical system 22. The prism 24 is placed at or near the pupil plane of the detection optical system 21 and the illumination optical system 22. Each of the mold mark 4 and the substrate mark 5 is formed by a diffraction grating including a pattern arranged in a first direction (the X-direction or the Y-direction). The detection optical system 21 guides light (diffracted light) transmitted through the mold mark 4 and the substrate mark 5 illuminated by the illumination optical system 22 to an image sensor 25. The light from the mold mark 4 and the substrate mark 5 is captured as moire (moire fringes) by the image sensor 25. That is, the light transmitted through the mold mark 4 and the substrate mark 5 is light emitted from the light source 23, transmitted through both the mold mark 4 and the substrate mark 5, and incident on a detection unit (the image sensor 25). As the image sensor 25, a charge-coupled device (CCD) sensor or a complementary metal-oxide-semiconductor (CMOS) sensor is used. As described above, the detection optical system 21 functions as the detection unit for detecting moire that occurs by the mold mark 4 and the substrate mark 5 overlapping each other. Based on the moire detected by the image sensor 25, a processing unit 26 obtains the relative position between the mold mark 4 and the substrate mark 5. The function of the processing unit 26, however, may be included in the control unit 30 (i.e., the processing unit 26 and the control unit 30 may be integrally configured).

The prism 24 includes on its bonding surface a reflective film 24a for reflecting light in a peripheral portion of the pupil plane of the illumination optical system 22. The reflective film 24a functions as an aperture stop defining the shape of the pupil intensity distribution of the illumination optical system 22. Further, the reflective film 24a also functions as an aperture stop defining the size of the pupil of the detection optical system 21 (or a numerical aperture NAO of the detection optical system 21).

The prism 24 may be a half prism including a semipermeable membrane on its bonding surface, or may be a plate-like optical element including a reflective film on its surface. Further, to change the shape of the light intensity distribution at the pupil plane (the pupil shape) of the illumination optical system 22 or the detection optical system 21, the prism 24 may be replaceable with another prism by a switching mechanism such as a turret or a slide mechanism. Further, the position where the prism 24 is placed may not be at or near the pupil plane of the detection optical system 21 and the illumination optical system 22.

In the present exemplary embodiment, the pupil shape of the illumination optical system 22 is defined by the reflective film 24a of the prism 24. The present disclosure, however, is not limited to this. For example, similar effects can also be obtained by placing a mechanical stop or a stop drawn on a glass surface at the pupil position of the illumination optical system 22.

Figure 3:
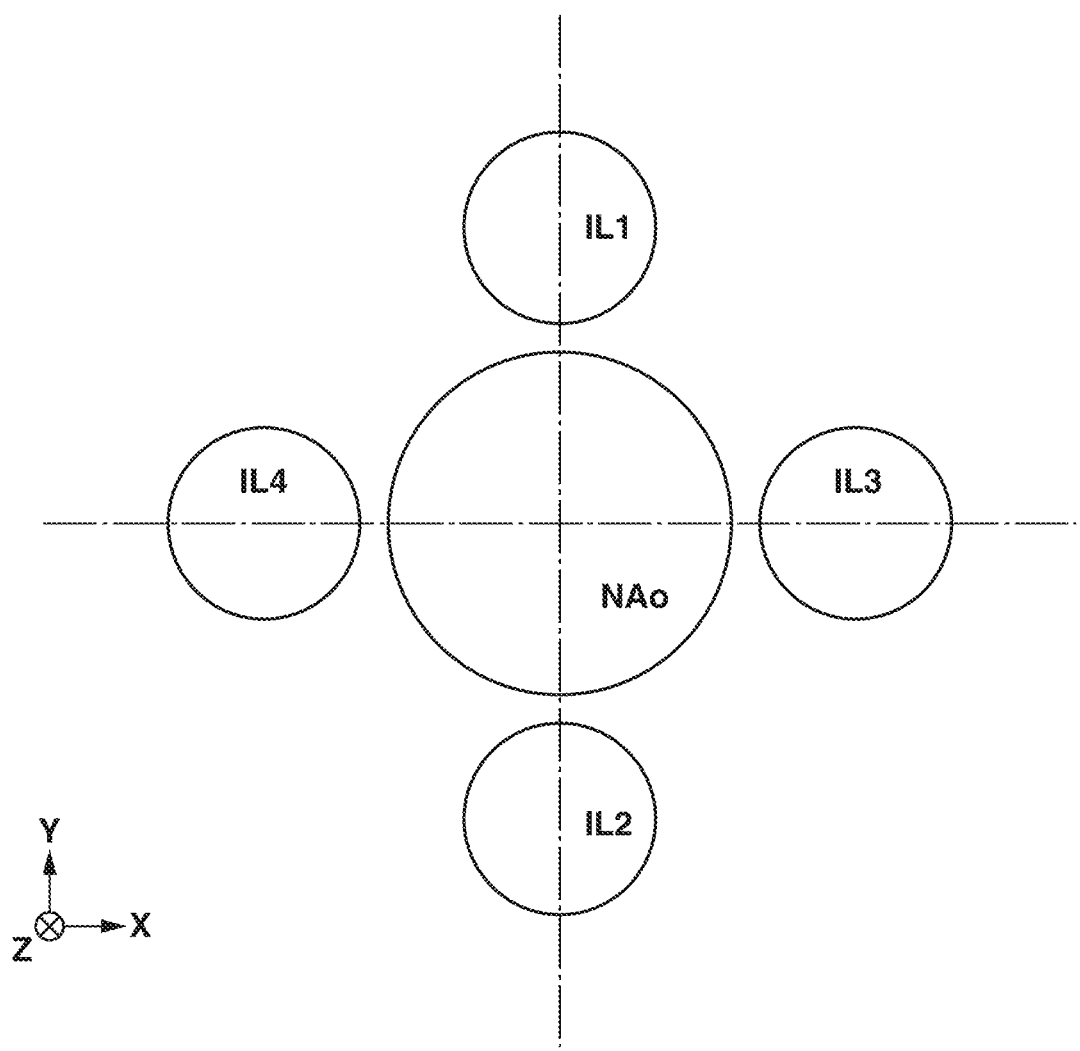
FIG. 3 is a diagram illustrating a relationship between a pupil intensity distribution of an illumination optical system of the position detection device and a numerical aperture of a detection optical system of the position detection device.

FIG. 3 is a diagram illustrating the relationship between the pupil intensity distribution (IL1 to IL4) of the illumination optical system 22 of the position detection device 6 and the numerical aperture NAO of the detection optical system 21. In FIG. 3, the size of the pupil at the pupil plane of the illumination optical system 22 is indicated by the numerical aperture NAO of the detection optical system 21. In the present exemplary embodiment, the pupil intensity distribution of the illumination optical system 22 includes a first pole ILL a second pole IL2, a third pole IL3, and a fourth pole IL4. The illumination optical system 22 illuminates the mold mark 4 or the substrate mark 5 with light incident perpendicular to the direction (a first direction) in which the pattern of the mold mark 4 or the substrate mark 5 is arranged, and with light incident parallel to the first direction. As described above, the reflective film 24a that functions as an aperture stop is placed at the pupil plane of the illumination optical system 22, whereby a plurality of poles, i.e., the first pole IL1 to the fourth pole IL4, can be formed from the single light source 23. In a case where a pupil intensity distribution having a plurality of poles (peaks) is thus formed, a plurality of light sources is not required. Thus, it is possible to simplify or downsize the position detection device 6.

Figure 4A:
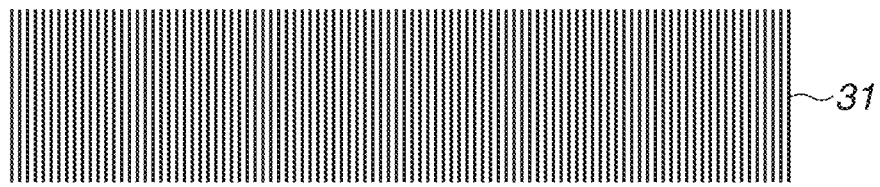
FIGS. 4A to 4D are diagrams illustrating marks including diffraction gratings and moire detected by the position detection device.
Figure 4B:
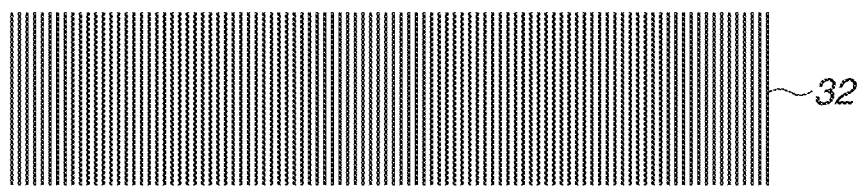
Figure 4C:
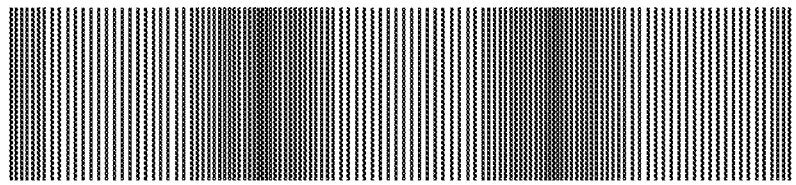
Figure 4D:
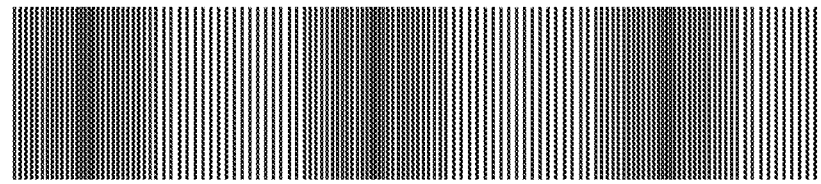

With reference to FIGS. 4A to 4D, a description will be given of the principle of the occurrence of moire due to diffracted light from the mold mark 4 and the substrate mark 5, and the detection of the relative position between the mold mark 4 (the mold 2) and the substrate mark 5 (the substrate 1) using the moire. FIG. 4A illustrates the mold mark 4 (a first diffraction grating 31) formed on the mold 2. FIG. 4B illustrates the substrate mark 5 (a second diffraction grating 32) formed on the substrate 1. The first diffraction grating 31 and the second diffraction grating 32 are slightly different from each other in the period of the pattern (the grating) in the measurement direction (the x-direction in FIG. 4). If two such diffraction gratings different from each other in the period of the grating are placed one on top of the other, then as illustrated in FIGS. 4C and 4D, the interference between beams of diffracted light from the two diffraction gratings causes a pattern having a period reflecting the difference in period between the diffraction gratings, i.e., moire, to appear.

At this time, the phase of the moire changes depending on the relative position between the diffraction gratings. Thus, by detecting the moire, it is possible to obtain the relative position between the mold mark 4 and the substrate mark 5, i.e., the relative position between the mold 2 and the substrate 1. Specifically, if the first diffraction grating 31 and the second diffraction grating 32, which are slightly different in period from each other, are placed one on top of the other, beams of diffracted light from the first diffraction grating 31 and the second diffraction grating 32 overlap each other, whereby, as illustrated in FIG. 4C, moire having a period reflecting the difference in period occurs. As described above, the light and dark positions (the phase of the fringes) of the moire change depending on the relative position between the first diffraction grating 31 and the second diffraction grating 32. For example, if the relative position between the first diffraction grating 31 and the second diffraction grating 32 changes in the X-direction, the moire illustrated in FIG. 4C changes to the moire illustrated in FIG. 4D. Moire occurs as large-period fringes by increasing the actual amount of positional shift (the amount of change) between the first diffraction grating 31 and the second diffraction grating 32. Thus, even if the resolving power of the detection optical system 21 is low, it is possible to detect the relative position between the first diffraction grating 31 and the second diffraction grating 32 with high accuracy.

A case is considered where, to detect such moire, beams of light from the first diffraction grating 31 and the second diffraction grating 32 are detected in a bright field (the diffraction gratings 31 and 32 are illuminated from a direction perpendicular to the diffraction gratings 31 and 32, and beams of diffracted light diffracted in the perpendicular direction by the diffraction gratings 31 and 32 are detected). In this case, the detection optical system 21 also detects 0-th order light from the first diffraction grating 31 and the second diffraction grating 32. The 0-th order light causes a reduction in the contrast of the moire. Thus, as described above, the position detection device 6 has a dark-field configuration that does not detect 0-th order light (i.e., illuminates the diffraction gratings 31 and 32 by oblique incidence).

In the present exemplary embodiment, to detect moire even with the dark-field configuration, one of the first diffraction grating 31 and the second diffraction grating 32 is a checkerboard-like diffraction grating as illustrated in FIG. 5A, and the other diffraction grating is a diffraction grating as illustrated in FIG. 5B. The diffraction grating illustrated in FIG. 5A includes a pattern periodically arranged in the measurement direction (the x-direction) and a pattern periodically arranged in a direction (the y-direction) orthogonal to the measurement direction.

With reference to FIGS. 3, 5A, and 5B, light from the first pole IL1 and the second pole IL2 is emitted to the diffraction gratings and diffracted in the Y-direction by the checkerboard-like diffraction grating. At this time, in the light diffracted by the diffraction grating, light in the Z-axis direction is detected. The light diffracted in the Y-direction has relative position information regarding the X-direction, is incident on a detection area (NAO) on the pupil of the detection optical system 21, and is detected by the image sensor 25. Using the detected light, it is possible to obtain the relative position between the two diffraction gratings.

In the relationships between the pupil intensity distribution illustrated in FIG. 3 and the diffraction gratings illustrated in FIGS. 5A and 5B, light from the third pole IL3 and the fourth pole IL4 is not used to detect the relative position between the diffraction gratings. In a case where the relative position between diffraction gratings illustrated in FIGS. 5C and 5D is detected, light from the third pole IL3 and the fourth pole IL4 is used to detect the relative position between the diffraction gratings, and light from the first pole IL1 and the second pole IL2 is not used to detect the relative position between the diffraction gratings. Further, in a case where the pair of diffraction gratings illustrated in FIGS. 5A and 5B and the pair of diffraction gratings illustrated in FIGS. 5C and 5D are placed in the same field of view of the detection optical system 21, and the relative positions in two directions are simultaneously detected, the pupil intensity distribution illustrated in FIG. 3 is very effective.

Figure 6:
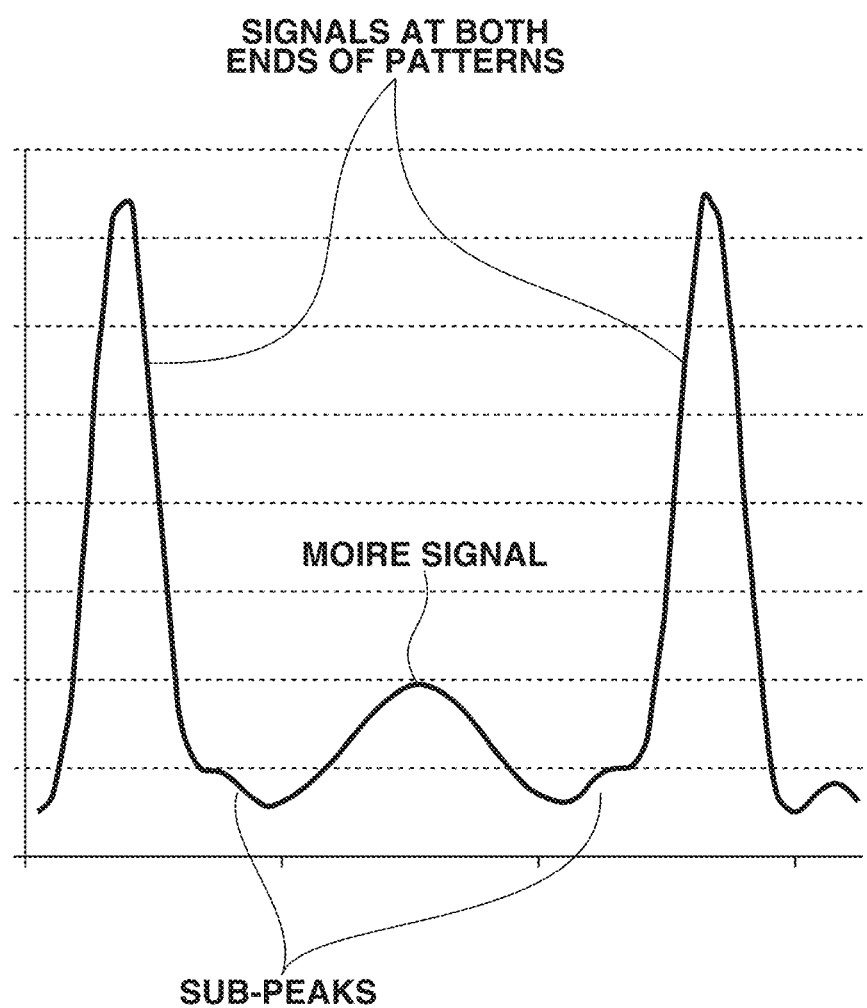
FIG. 6 is a diagram illustrating a moire signal.

A description will be given of the influence of light in a direction that is not used to detect the relative position between diffraction gratings. For example, in the case of the pair of diffraction gratings illustrated in FIGS. 5A and 5B, the light from the third pole IL3 and the fourth pole IL4 is scattered or diffracted in end portions of the diffraction gratings (at both ends of the patterns of the diffraction gratings). FIG. 6 illustrates (a cross section of) a moire signal obtained by optical simulation in such a case. With reference to FIG. 6, large signals (light) occur at both ends of the patterns of the diffraction gratings. Further, it can also be confirmed that small sub-peaks occur. These signals are considered as signals that largely occur by the continuous patterns (the grating conditions) of the diffraction gratings being interrupted in the end portions. Such a phenomenon also occurs in a case where diffraction gratings are detected in a bright field, but notably occurs particularly in a case where diffraction gratings are detected in a dark field. The sub-peaks overlap the detection area of the moire signal. If the sub-peaks are mixed into the moire signal, an error occurs in the detection of the relative position between the diffraction gratings.

Figure 7:
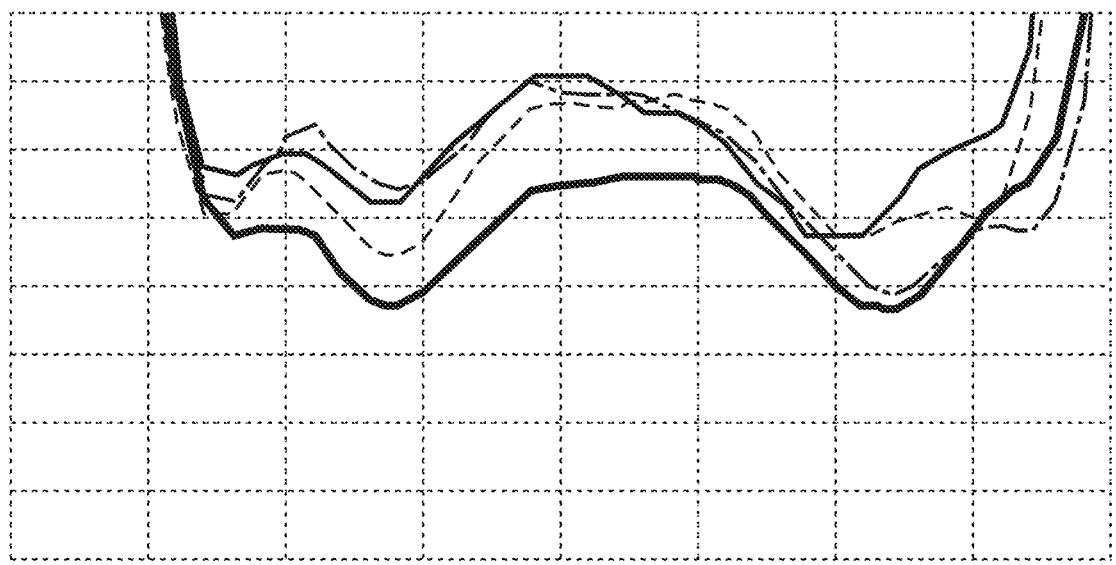
FIG. 7 is a diagram illustrating signals of light from marks detected by a detection unit of the position detection device.

FIG. 7 illustrates signals actually obtained by the position detection device 6 and used for position adjustment. FIG. 7 is the superimposed drawing of the results illustrating signals obtained by detecting four different marks. Peaks are blunter than those of an ideal moire waveform. Accordingly, the signal-to-noise (S/N) ratio decreases, and therefore, the position detection accuracy decreases.

Figure 8A:
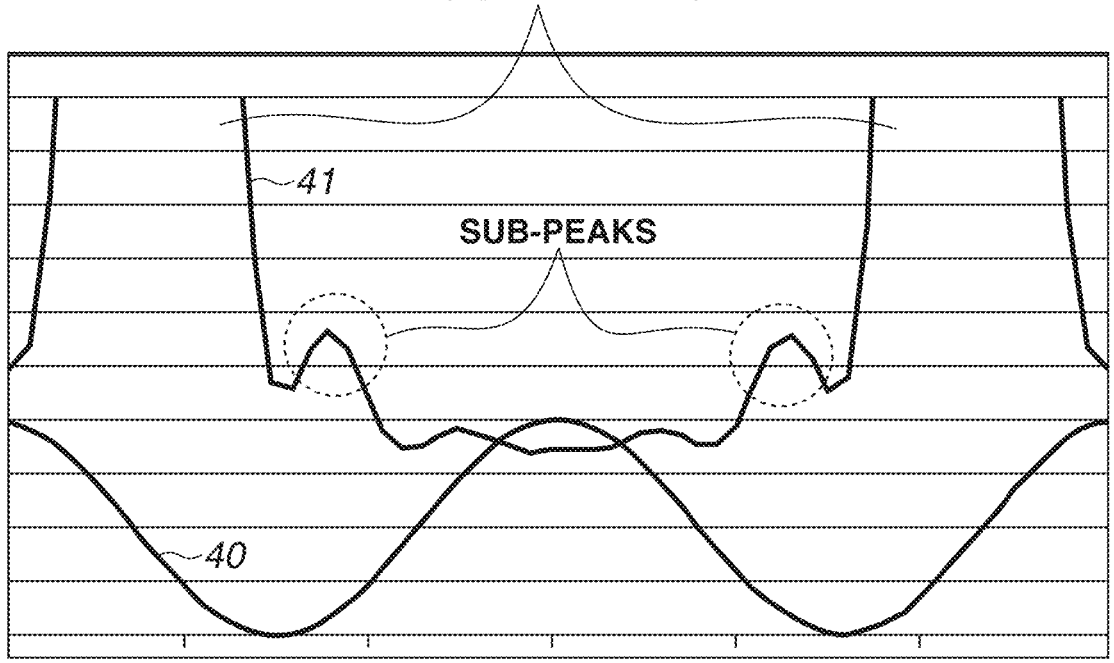
FIGS. 8A and 8B are diagrams illustrating moire detected by the detection unit and a simulation waveform of a noise component.
Figure 8B:
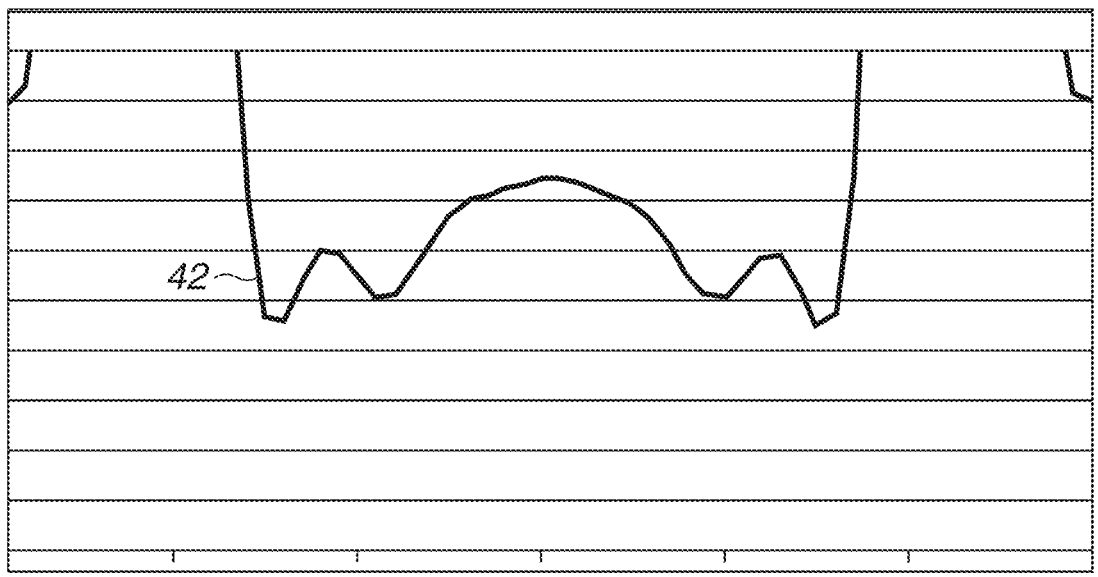

FIGS. 8A and 8B are waveforms representing moire obtained by optical simulation. In the waveforms in FIGS. 8A and 8B, the horizontal axis represents the position in the measurement direction of a mark, and the vertical axis represents the light intensity from the mark detected by the image sensor 25. In FIG. 8A, an alignment mark waveform (a noise component 41) is a detected signal (a reflection signal) obtained by the image sensor 25 when only the mold mark 4 formed on the mold 2 is irradiated. That is, light from the mold mark 4 is light emitted from the light source 23, transmitted not through the substrate mark 5 but through the mold mark 4, and incident on the detection unit (the image sensor 25). In FIG. 8A, a moire waveform 40 is ideal moire that occurs due to light from the mold mark 4 formed on the mold 2 and the substrate mark 5 formed on the substrate 1. FIG. 8B illustrates a waveform 42 obtained by combining the alignment mark waveform and the moire waveform 40. It is understood that the detected signals obtained by the position detection device 6 illustrated in FIG. 7 are similar in shape to the waveform 42 illustrated in FIG. 8B, and the detected signals in FIG. 7 include reflection signals having sub-peaks from the mold mark 4 formed on the mold 2. It is understood that in the noise component 41 in FIG. 8A, sub-peaks occur at positions surrounded by dotted lines. Thus, it is understood that sub-peaks have influences on corresponding positions in the detected signals illustrated in FIGS. 8B and 7.

Figure 9:
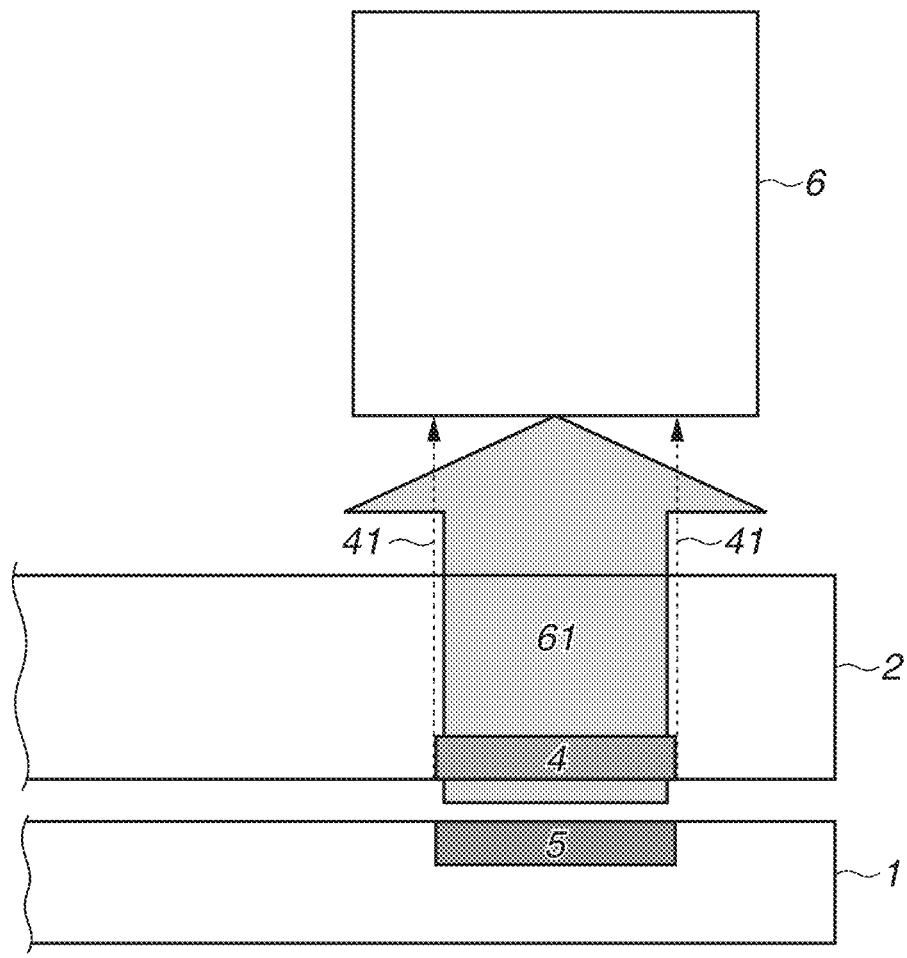
FIG. 9 is a diagram illustrating the moire detected by the detection unit and an optical path of the noise component.

FIG. 9 illustrates a side view of the substrate mark 5 formed on the substrate 1 and the mold mark 4 formed on the mold 2. FIG. 9 is an optical path diagram illustrating the state where the noise component 41 (the alignment mark waveform) from the mold mark 4 formed on the mold 2 is mixed in with moire 61 that occurs due to light from the substrate mark 5 and light from the mold mark 4. The moire 61 is the optical path of moire that occurs by reflected light from the mold mark 4 provided on the mold 2 and reflected light from the substrate mark 5 provided on the substrate 1 overlapping each other. The noise component 41 illustrated in FIG. 9 includes the optical paths of sub-peaks that occur in the diffraction grating of the mold mark 4 placed on the mold 2. As described above, the position detection device 6 also simultaneously detects the noise component 41 that can cause an error, in addition to the moire 61 that is necessary to detect the relative position between the marks 4 and 5 (the diffraction gratings).

In an alignment step of aligning the mold 2 and the substrate 1, the imprint apparatus 100 according to the present exemplary embodiment aligns the mold 2 and the substrate 1 using a corrected signal obtained by removing a noise component due to the mold mark 4 on the mold 2 from a detected signal detected by the position detection device 6. An alignment method according to the present exemplary embodiment removes a noise component from a detected signal and thereby can improve the accuracy of alignment. A corrected signal (moire) obtained by removing the noise component from the detected signal has an excellent S/N ratio. This improves the position detection accuracy.

Figure 10:
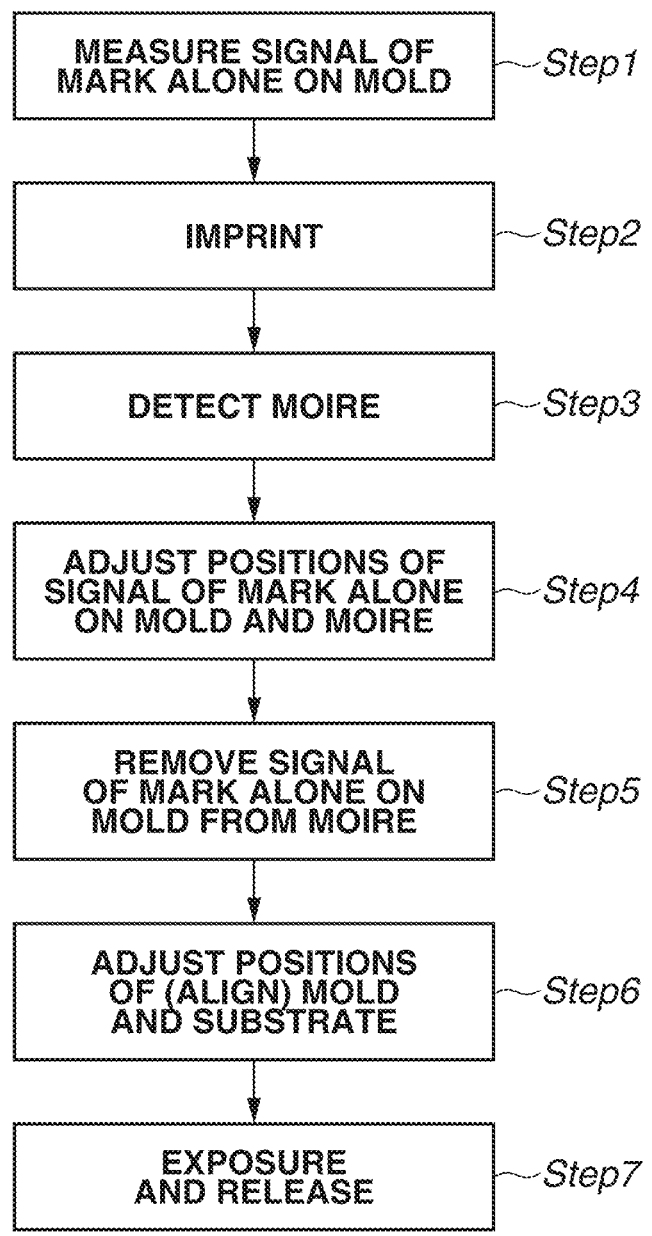
FIG. 10 is a flowchart illustrating an imprint method.
Figure 11:
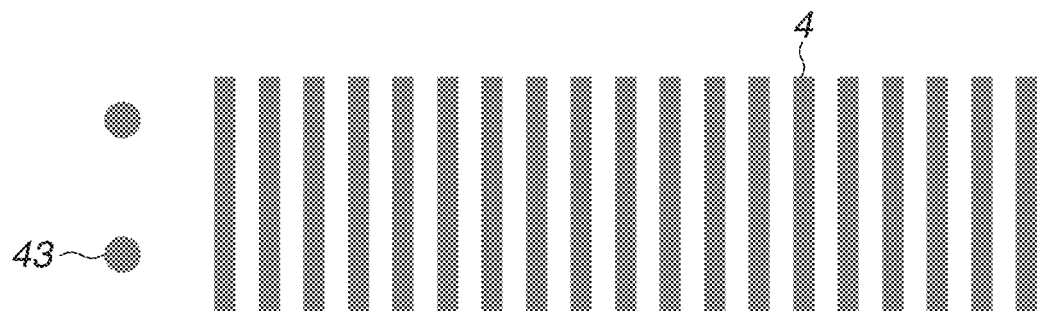
FIG. 11 is a diagram illustrating a mark including a diffraction grating, and a mark used to adjust positions of signals.

Next, with reference to a flowchart in FIG. 10, a position detection method according to the present exemplary embodiment will be described. First, to achieve the position detection method according to the present exemplary embodiment, in step S1, the position detection device 6 provided in the imprint apparatus 100 measures a signal of the mold mark 4 formed on the mold 2. The position detection device 6 optically observes the mold mark 4 provided on the mold 2 and measures the signal of the mold mark 4. As illustrated in FIG. 11, a sub-mark 43 (an assisting mark) is placed in the mold mark 4, and the position detection device 6 measures signals also including a signal of the sub-mark 43. The control unit 30 records the relative position between the signal of the mold mark 4 and the signal of the sub-mark 43 in addition to the signal of the mold mark 4. As illustrated in FIG. 11, the sub-mark 43, for example, is formed in a dot shape in an assisting manner. As described below, since the sub-mark 43 is used to position the diffraction grating of the mold mark 4, it is desirable that the sub-mark 43 should be formed outside the direction in which the diffraction grating of the mold mark 4 is arranged. Further, in FIG. 11, the sub-mark 43 is formed only in a −x-direction of the mold mark 4 (the direction in which the diffraction grating is arranged). The present disclosure, however, is not limited to this. Alternatively, the sub-mark 43 may be formed in a +x-direction. Further, the shape of the sub-mark 43 can be another shape instead of a dot shape. However, to position the signals detected by the position detection device 6, it is desirable that a peak signal should be formed by light from the sub-mark 43.

The signal of the mold mark 4 on the mold 2 does not change, and therefore can be measured in advance. In step S1, the signal of the mark 4 on the mold 2 may be measured according to each different mold, or may be measured with respect to each different mold mark 4. Further, when the signal of the mold mark 4 is measured, the same scope as that of the position detection device 6 for detecting moire in alignment can be used. Further, instead of detecting the mold mark 4 on the mold 2 using the position detection device 6, a noise signal may be obtained by optical simulation.

In step S2, the imprint apparatus 100 supplies the imprint material onto the substrate 1 held by the substrate stage 13 and brings the imprint material on the substrate 1 into contact with the mold 2 on which a pattern is formed (an imprinting step).

In step S3, the position detection device 6 detects moire from the substrate mark 5 formed on the substrate 1 and the mold mark 4 formed on the mold 2. Specifically, in the state where the imprint material on the substrate 1 and the mold 2 are in contact with each other, the position detection device 6 illuminates the mold mark 4 and the substrate mark 5 with light and captures the light from the mold mark 4 and the substrate mark 5 using the image sensor 25, thereby detecting moire. At this time, a signal of the sub-mark 43 provided in the mold mark 4 also appears together with the moire. Thus, the position detection device 6 also detects the signal of the sub-mark 43 in addition to the moire. Similarly to step S1, the control unit 30 records the relative position between the moire and the signal of the sub-mark 43 in addition to the moire.

Next, the imprint apparatus 100 performs position adjustment using a corrected signal obtained by removing a noise component detected in step S1 from the moire (a detected signal) detected in step S3. However, when the noise component detected in step S1 is removed from the moire detected in step S3, the noise component cannot be removed with high accuracy unless the positions of these signals (waveforms) are adjusted according to the position of the mark 4.

In the position detection method according to the present exemplary embodiment, using the signal of the sub-mark 43 detected simultaneously with the moire and the signal of the sub-mark 43 detected simultaneously with the noise component, the relative position between these signals is adjusted. In step S4, the imprint apparatus 100 adjusts the positions of the signal (the noise component) of the mark 4 on the mold 2 obtained in step S1 and the moire (the detected signal) obtained in step S3. At this time, using the positions of the signals of the sub-mark 43 detected in steps S1 and S3, the imprint apparatus 100 adjusts the positions of the moire and the noise component.

After adjusting the position of the detected signal in step S4, then in step S5, the imprint apparatus 100 removes the signal of the mold mark 4 on the mold 2 measured in advance, as noise from the moire. The imprint apparatus 100 removes the noise component from the moire (the detected signal) detected in step S3, thereby generating a signal (an alignment signal) used to adjust the positions of the mold 2 and the substrate 1. This process can be performed by the control unit 30 of the imprint apparatus 100.

In step S6, based on the alignment signal obtained by removing the noise component from the moire (the detected signal), the control unit 30 obtains the relative position between the mold mark 4 and the substrate mark 5. Then, based on the relative position between the marks 4 and 5, the control unit 30 calculates the amount of shift between the mold 2 and the substrate 1 and moves the imprint head 3 or the substrate stage 13 in the x-direction, the y-direction, or the rotational direction ($\theta z$) about the z-axis, thereby adjusting the positions of (aligning) the mold 2 and the substrate 1.

Using a corrected signal obtained by removing a noise component from a detected signal, the imprint apparatus 100 according to the present exemplary embodiment can adjust the positions of the mold 2 and the substrate 1 with high accuracy. As described above, by removing a noise component measured in advance from a detected signal of moire, it is possible to remove the influence of scattered light or diffracted light at the ends of an alignment mark. Thus, it is possible to detect the relative position with high accuracy.

In step S7, in the state where the mold 2 and the imprint material on the substrate 1 are in contact with each other, the imprint apparatus 100 illuminates the imprint material with the ultraviolet light 7 (curing light) through the mold 2, thereby curing the imprint material (an exposure step and a curing step). Then, the imprint apparatus 100 pulls away (releases) the mold 2 from the cured imprint material, thereby forming the pattern of the imprint material on the substrate 1 (a release step).

In a case where a plurality of shot areas is placed on the substrate 1, and a pattern is formed with respect to each shot area, then after step S7, the processing returns to step S2. In step S2, the imprint apparatus 100 forms a pattern (an imprint process) in the next shot area. The imprint apparatus 100 may obtain a signal of the mold mark 4 in step S1 in advance, and does not need to measure the signal of the mold mark 4 with respect to each shot area. Further, in a case where there is a plurality of substrates on which the pattern of the imprint material is to be formed, a substrate on which the formation of the pattern is completed in a plurality of shot areas is carried out of the imprint apparatus 100, a new substrate is carried into the imprint apparatus 100, and the pattern is formed on the new substrate. Also in this case, similarly, if the mold 2 is the same, the imprint apparatus 100 does not need to newly acquire a noise component in step S1. Meanwhile, when the mold 2 is replaced with a new mold, the imprint apparatus 100 can appropriately perform step S1, thereby performing the step of acquiring a noise component of a mark on the mold.

This reduces (prevents) a noise component from the mold mark 4 on the mold 2, and the position detection device 6 can detect the relative position between the mold mark 4 and the substrate mark 5 with high accuracy. Thus, based on the detection result of the position detection device 6, the imprint apparatus 100 can adjust the positions of the mold 2 and the substrate 1 with high accuracy and reduce a failure in the transfer of a pattern (a product defect).

The imprint apparatus has been described regarding an imprint method for curing an imprint material using the light-curing method. The present exemplary embodiment, however, is not limited to the light-curing method. Alternatively, a method for curing an imprint material using heat may be employed. In the light-curing method, an ultraviolet-curable resin is used and cured by being irradiated with ultraviolet light in the state where a mold is pressed against a substrate via the resin. Then, the mold is pulled away from the cured resin, thereby forming a pattern. In the present exemplary embodiment, the ultraviolet light 7 is emitted as the curing light. The wavelength of the light, however, can be appropriately determined according to the imprint material supplied onto the substrate 1. In contrast, in the method using heat, in the state where the fluidity of a thermoplastic resin is enhanced by heating the resin to a temperature at or above the glass-transition temperature, a mold is pressed against a substrate via the resin. After the resin is cooled, the mold is pulled away from the resin, thereby forming a pattern.

(Method for Manufacturing Article)

The pattern of a cured product formed using an imprint apparatus is permanently used in at least a part of each of various articles, or temporarily used to manufacture each of various articles. Examples of the article include an electric circuit element, an optical element, microelectromechanical systems (MEMS), a recording element, a sensor, and a mold. Examples of the electric circuit element include volatile or non-volatile semiconductor memories such as a dynamic random-access memory (DRAM), a static random-access memory (SRAM), a flash memory, and a magneto resistive random-access memory (MRAM), and semiconductor devices such as a large-scale integration (LSI) device, a CCD, an image sensor, and a field-programmable gate array (FPGA). Examples of the mold include a mold for imprint.

The pattern of the cured product is used as is as a component member of at least a part of the article, or temporarily used as a resist mask. After etching or ion implantation is performed in the step of processing a substrate, the resist mask is removed.

Figure 12A:
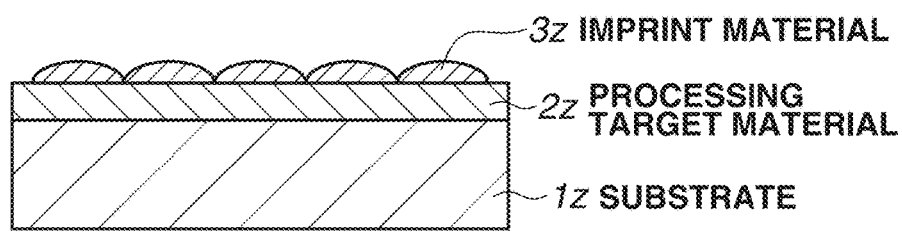
FIGS. 12A to 12F are diagrams illustrating a method for manufacturing an article.

Next, a specific method for manufacturing an article will be described. As illustrated in FIG. 12A, a substrate 1z such as a silicon wafer, on the surface of which a processing target material 2z such as an insulator is formed, is prepared. Next, an imprint material 3z is applied to the surface of the processing target material 2z by an inkjet method. FIG. 12A illustrates the state where the imprint material 3z in the form of a plurality of droplets is applied onto the substrate 1z.

Figure 12B:
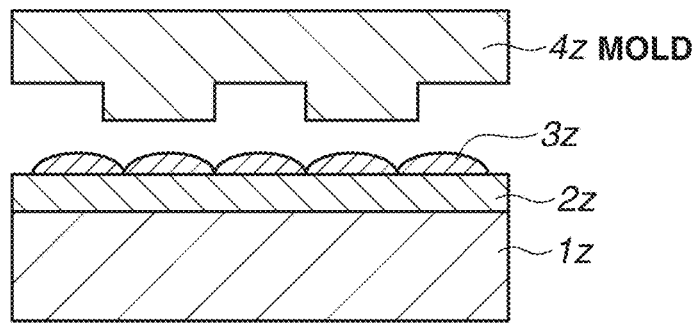
Figure 12C:
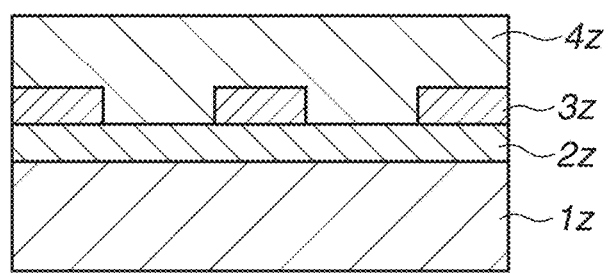

As illustrated in FIG. 12B, the side of a mold 4z for imprint having an uneven pattern formed thereon is directed at and opposed to the imprint material 3z on the substrate 1z. As illustrated in FIG. 12C, the substrate 1z onto which the imprint material 3z is applied and the mold 4z are brought into contact with each other, and pressure is applied to the imprint material 3z and the mold 4z. The imprint material 3z fills the gap between the mold 4z and the processing target material 2z. If the imprint material 3z is irradiated with light as curing energy through the mold 4z in this state, the imprint material 3z cures.

Figure 12D:
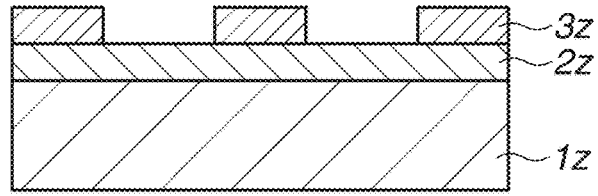

As illustrated in FIG. 12D, after the imprint material 3z is cured, and if the mold 4z and the substrate 1z are pulled away from each other, the pattern of the cured product of the imprint material 3z is formed on the substrate 1z. This pattern of the cured product has such a shape that a recessed portion of the mold 4z corresponds to a protruding portion of the cured product, and a protruding portion of the mold 4z corresponds to a recessed portion of the cured product. That is, the uneven pattern of the mold 4z is transferred to the imprint material 3z.

Figure 12E:
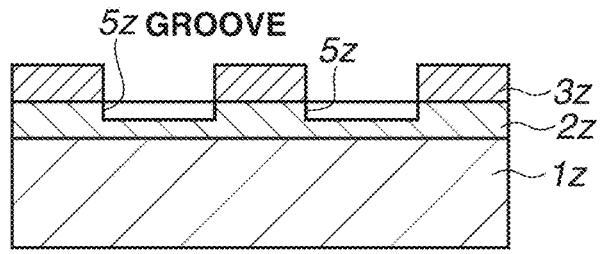
Figure 12F:
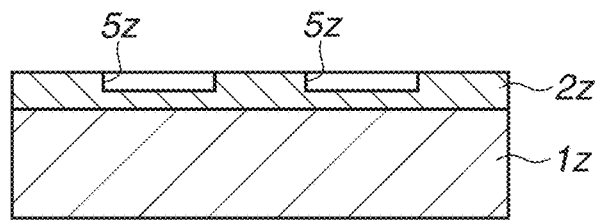

As illustrated in FIG. 12E, if etching is performed using the pattern of the cured product as an etching-resistant mask, then in the surface of the processing target material 2z, a portion where the cured product is not present or the cured product thinly remains is removed, thereby forming a groove 5z. It is also desirable to remove the portion where the cured product remains in advance by a different type of etching from the above etching. As illustrated in FIG. 12F, if the pattern of the cured product is removed, an article in which the groove 5z is formed on the surface of the processing target material 2z can be obtained. In this case, the pattern of the cured product is removed. Alternatively, instead of removing the pattern of the cured product even after the processing, the pattern of the cured product may be used as, for example, an interlayer insulating film included in a semiconductor device, i.e., a component member of the article.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2018-044355, filed Mar. 12, 2018, which is hereby incorporated by reference herein in its entirety.

What is claimed is:

1. A position detection device for adjusting positions of a mold and a substrate using a mold mark formed on the mold and a substrate mark formed on the substrate, the position detection device comprising:
   a detection unit configured to detect light from the mold mark and the substrate mark; and
   a processing unit configured to obtain a positional relationship between the substrate and the mold based on a detection result of the detection unit,
   wherein the processing unit obtains the positional relationship between the substrate and the mold based on a corrected signal obtained by removing a noise component based on the light from the mold mark from a detected signal based on the light from the mold mark and the substrate mark, and
   wherein, when removing the noise component based on the light from the mold mark from the detected signal based on the light transmitted through the mold mark and the substrate mark, the processing unit adjusts a position of the noise component relative to a position of the detected signal based on the light transmitted through the mold mark and the substrate mark.

2. The position detection device according to claim 1, wherein the light from the mold mark is light emitted from a light source, transmitted through the mold mark and not through the substrate mark, and incident on the detection unit.

3. The position detection device according to claim 1,
   wherein the light transmitted through the mold mark and the substrate mark is light emitted from a light source, transmitted through both the mold mark and the substrate mark, and incident on the detection unit, and
   wherein the light from the mold mark is light emitted from the light source, transmitted through the mold mark and not through the substrate mark, and incident on the detection unit.

4. The position detection device according to claim 1, wherein the detection unit detects moire that is light from a mold mark including a diffraction grating formed on the mold and a substrate mark including a diffraction grating formed on the substrate.

5. The position detection device according to claim 1,
   wherein an assisting mark is formed on the mold,
   wherein the detection unit detects light from the assisting mark in addition to the detected signal based on the light transmitted through the mold mark and the substrate mark,
   wherein the detection unit detects light from the assisting mark in advance in addition to the noise component based on the light from the mold mark, and
   wherein the processing unit performs the position adjustment based on a position of the assisting mark detected in addition to the detected signal based on the light transmitted through the mold mark and the substrate mark and a position of the assisting mark detected in addition to the noise component.

6. The position detection device according to claim 5, wherein the assisting mark is a mark having such a shape that light from the assisting mark detected by the detection unit is a peak signal.

7. A position detection method for detecting a positional relationship between a mold and a substrate using a mold mark formed on the mold and a substrate mark formed on the substrate, the position detection method comprising:
   detecting light from the mold mark and the substrate mark;
   removing a noise component based on light from the mold mark from a detected signal based on the light from the mold mark and the substrate mark; and
   obtaining the positional relationship between the substrate and the mold based on a corrected signal obtained by removing the noise component,
   wherein, when removing the noise component based on the light from the mold mark from the detected signal based on the light transmitted through the mold mark and the substrate mark, a position of the noise component relative to a position of the detected signal based on the light transmitted through the mold mark and the substrate mark is adjusted.

8. An imprint apparatus for forming a pattern of an imprint material on a substrate using a mold, the imprint apparatus comprising:
   a detection unit configured to detect light from a mold mark formed on the mold and a substrate mark formed on the substrate; and
   a processing unit configured to obtain a positional relationship between the substrate and the mold based on a detection result of the detection unit,
   wherein the processing unit obtains the positional relationship between the substrate and the mold based on a corrected signal obtained by removing a noise component based on the light from the mold mark from a detected signal based on the light from the mold mark and the substrate mark, and
   wherein, when removing the noise component based on the light from the mold mark from the detected signal based on the light transmitted through the mold mark and the substrate mark, the processing unit adjusts a position of the noise component relative to a position of the detected signal based on the light transmitted through the mold mark and the substrate mark.

9. A method for manufacturing an article, the method comprising:
   forming a pattern on a substrate by detecting a positional relationship between a mold and the substrate using a position detection method and adjusting positions of the mold and the substrate based on the positional relationship; and
   processing the substrate on which the pattern is formed,
   wherein the position detection method for detecting a positional relationship between a mold and a substrate using a mold mark formed on the mold and a substrate mark formed on the substrate, the position detection method comprising:
   detecting light from the mold mark and the substrate mark;
   removing a noise component based on light from the mold mark from a detected signal based on the light from the mold mark and the substrate mark; and
   obtaining the positional relationship between the substrate and the mold based on a corrected signal obtained by removing the noise component,
   wherein, when removing the noise component based on the light from the mold mark from the detected signal based on the light transmitted through the mold mark and the substrate mark, a position of the noise component relative to a position of the detected signal based on the light transmitted through the mold mark and the substrate mark is adjusted, and
   wherein an article is manufactured from the processed substrate.

* * * * *